United States Patent
Itoh

(10) Patent No.: US 7,148,675 B2
(45) Date of Patent: Dec. 12, 2006

(54) RING TYPE CURRENT SENSOR

(75) Inventor: Tomoki Itoh, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/110,839

(22) Filed: Apr. 21, 2005

(65) Prior Publication Data

US 2005/0237050 A1 Oct. 27, 2005

(30) Foreign Application Priority Data

Apr. 23, 2004 (JP) ............................. 2004-128311

(51) Int. Cl.
*G01R 15/20* (2006.01)
(52) U.S. Cl. .............................. 324/117 R; 324/117 H; 324/252; 336/229
(58) Field of Classification Search ............ 324/117 R, 324/117 H, 252, 225; 361/115; 336/229, 336/234
See application file for complete search history.

(56) References Cited

U.S. PATENT DOCUMENTS 6,628,495 B1 * 9/2003 Gerfast ....................... 361/115
6,759,840 B1 * 7/2004 Marasch et al. ........ 324/117 H
2002/0067239 A1 * 6/2002 Nathasingh et al. ........ 336/234
2003/0227284 A1 12/2003 Marasch et al.

FOREIGN PATENT DOCUMENTS

JP  A-2003-167009  6/2003
JP  2003-215170    7/2003

* cited by examiner

*Primary Examiner*—Jermele Hollington
*Assistant Examiner*—Arleen M. Vazquez
(74) *Attorney, Agent, or Firm*—Posz Law Group, PLC

(57) ABSTRACT

A ring type current sensor has a C-shaped core and a magnetic sensor. An inner circumference of the core defines a detection field of a current. Both end faces in a circumferential direction of the core forms a gap therebetween. A cross-sectional area of the core perpendicular to the circumferential direction gradually increases from the both end faces to a portion opposite to the gap in a diametrical direction. A magnetic sensor is disposed in the gap. Preferably, the core is a stack of a plurality of core plates having different shapes.

12 Claims, 4 Drawing Sheets

RING TYPE CURRENT SENSOR

CROSS REFERENCE TO RELATED APPLICATION

This application is based upon and claims the benefit of priority of Japanese Patent Application No. 2004-128311 filed on Apr. 23, 2004, the content of which is incorporated herein by reference.

FIELD OF THE INVENTION

The present invention relates to a ring type current sensor provided with a C-shaped core which provides a magnetic path therein and a magnetic sensor disposed in a gap between both end faces in a circumferential direction of the core.

BACKGROUND OF THE INVENTION

A ring type current sensors use a right-hand rule. As disclosed in JP-2003-167009-A2 for example, the ring type current sensor includes a C-shaped core which provides a magnetic path therein and a magnetic field sensor such as a Hall effect sensing device disposed in a gap formed between both end faces in a circumferential direction of the core. The ring current sensor detects a magnitude of a current flowing through a conductor such as a bus bar passing through the core.

The magnitude of current flowing in the conductor is directly proportional to the magnetic flux density in the magnetic path including the gap. The magnetic field sensor outputs a voltage proportional to the magnitude of the magnetic flux density in the gap. Thus, an output voltage of the magnetic field sensor indicates the magnitude of the current flowing in the conductor.

A conventional ring type current sensor such as that shown in FIG. 7 has a C-shaped core 101 disposed to surround a current conductor or a bus bar 3 and having a constant cross-sectional area in a direction perpendicular to the magnetic flux passing therethrough. This sensor causes a magnetic flux concentration at a portion 112 opposite to a gap 102 in a diametrical direction of the core 101, that is, at the intermediate portion between two opposing end faces 111 in the circumferential direction of the core 101. The magnetic flux concentration is especially prominent at a radially inner side of the portion 112. The magnetic flux concentration increases a magnetic hysteresis at this portion 112.

Especially in a ring type current sensor 4 for detecting a large current magnitude, the magnetic hysteresis spoils the proportional relation between the actual current and the output voltage of the magnetic sensor. The core 101 made of a magnetic material having a relatively small magnetic hysteresis can restrict this drawback. This kind of magnetic material however increases a manufacturing cost of the ring type current sensor.

SUMMARY OF THE INVENTION

The object of the present invention, in view of the above-described drawback, is to provide a ring type current sensor having a high current-measuring accuracy restricting an increase of the manufacturing cost.

The ring type current sensor has a C-shaped conductor core, a bus bar and a magnetic sensor. An inner circumference of the core defines a detection field for enclosing a conductor to flow a current that is to be detected. Both end faces in the circumferential direction of the core forms a gap therebetween. A cross-sectional are of the core perpendicular to the circumferential direction gradually increases from both end faces to a portion opposite to the gap. The magnetic sensor is disposed in the gap. The bus bar may be disposed in the detection field as a component of the sensor. Preferably, the core is a stack of a plurality of core plates of which at least one has a different shape from that of the others.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

DESCRIPTION OF THE PREFERRED EMBODIMENTS (First Embodiment)

A ring type current sensor according to a first embodiment of the present invention, as shown in FIGS. 1, 2 and 3A to 3E, has a C-shaped core 1 provided with a gap 2 between both end faces 11 in a circumferential direction of the core 1. The core 1 and the gap 2 define a magnetic path therein. Both end faces 11 of the C-shaped core 1 are disposed in parallel with each other to uniform a clearance between both end faces 11 and a magneto-resistance distribution in the gap 2.

Figure 1:
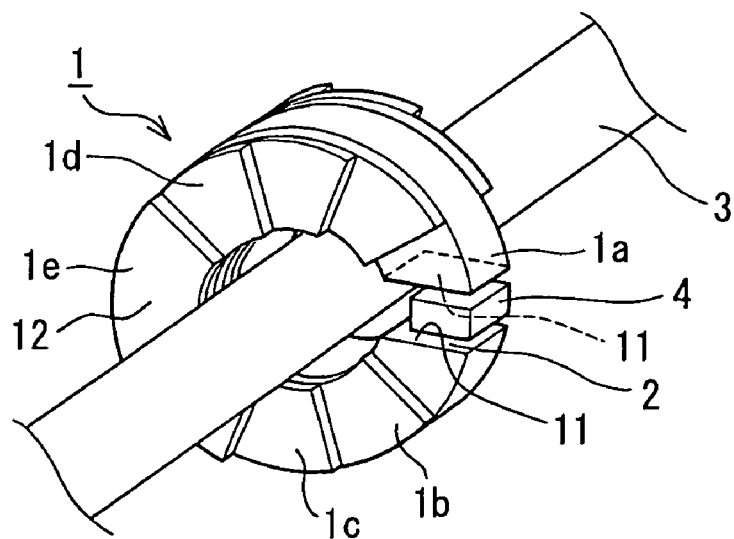
FIG. 1 is a perspective view showing a ring type current sensor according to a first embodiment of the present invention.

The core 1 encloses a bus bar 3 for flowing a current to be detected and disposes a magnetic sensor 4 such as a Hall effect sensing device in the gap 2. Specifically, the magnetic sensor 4 is disposed perpendicular to a magnetic flux flowing in the magnetic path to generate an output voltage proportional to a magnetic flux density in the magnetic path including the gap 2. FIG. 1 shows the core 1 and the magnetic sensor 4 to have clearances therebetween, however, a practical assembly has the core 1 and the magnetic sensor 4 in contact with each other and a shorter clearance between both end faces 11 of the core 1 is desirable.

An entire body of the core 1 is made of a magnetically highly permeable metallic material such as Fe—Ni Alloy ("Permalloy" (trade name) etc.). The core 1 has an effective cross-sectional area perpendicular to a circumferential direction thereof (and perpendicular to the magnetic flux) gradually increasing from both end faces 11 to a portion 12 opposite to the gap 2.

Figure 2:
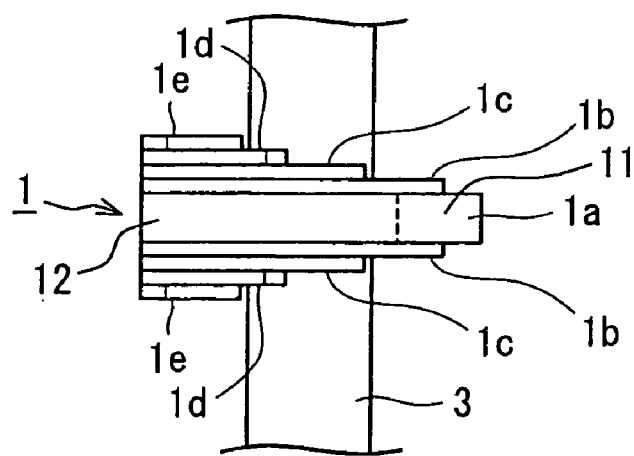
FIG. 2 is a side view showing the ring type current sensor of FIG. 1.
Figure 3A:
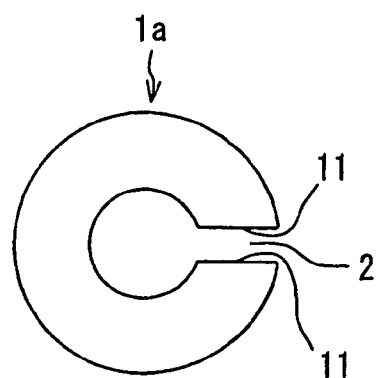
FIG. 3A is a plan view showing a first core plate of a core in the ring type current sensor of FIG. 1.
Figure 3B:
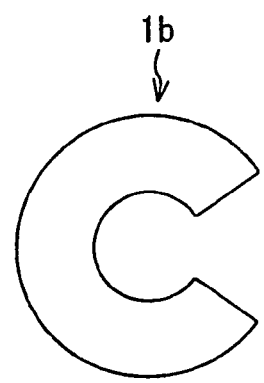
FIG. 3B is a plan view showing a second core plate of the core in the ring type current sensor of FIG. 1.
Figure 3C:
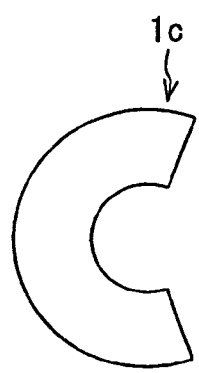
FIG. 3C is a plan view showing a third core plate of the core in the ring type current sensor of FIG. 1.
Figure 3D:
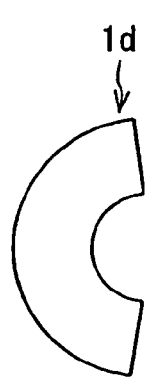
FIG. 3D is a plan view showing a fourth core plate of the core in the ring type current sensor of FIG. 1.
Figure 3E:
FIG. 3E is a plan view showing a fifth core plate of the core in the ring type current sensor of FIG. 1.

The core 1 includes a plurality of core plates 1a to 1e having a circumferential length different from each other as shown in FIGS. 3A to 3E. Specifically, the core plate 1a is disposed in the center of the core 1 and has a larger thickness than those of the other core plates 1b to 1e. A set of the core plates 1b to 1e are stacked on each side face of the core plate 1a in a longitudinal direction parallel to the bus bar 3 as shown in FIGS. 1 and 2. The gap 2 is defined between both end faces of the core plate 1a. The stack of the core plates 1a to 1e are integrated by a fixing member, etc and/or glued with an adhesive made of a highly permeable material.

According to the ring type current sensor of the first embodiment, the core 1 has the effective cross-sectional area gradually increasing from the both end faces 11 to the potion 12 opposite to the gap 2. That is, the portion 12 has a maximum effective cross-sectional area throughout the circumferential length of the core 1. The magnetic flux passing through the portion 12 disperses in the maximum effective cross-sectional area. Thus, the shape of the core 1 alleviates the magnetic flux concentration at the portion 12 opposite to the gap 2 and to uniform the magnetic flux intensity throughout the circumferential length of the core 1.

Accordingly, even when the magnitude of current flowing through the bus bar 3 is large, the proportional relation between the magnitude of the current flow in the bus bar 3 and the output voltage of the magnetic field sensor 4 is stable without being influenced by the magnetic hysteresis of the core 1. Consequently, the detection accuracy of the ring type current sensor is secured.

Further, the ring type current sensor does not require an expensive material with a relatively small magnetic hysteresis characteristic for the core 1. Thus, the core 1 restricts an increase of a manufacturing cost of the ring type current sensor with high detecting accuracy. Especially, the core 1 is composed of a plurality of magnetic plates 1a to 1e, so that the shape of the core 1 is derived without a complicated forming process and an increase of the manufacturing cost.

(Second Embodiment)

Figure 4:
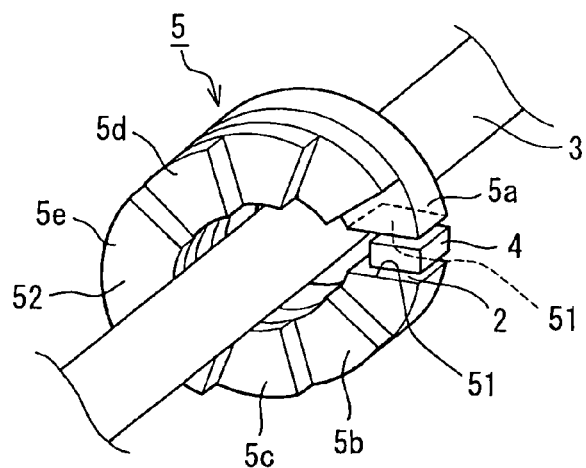
FIG. 4 is a perspective view showing a ring type current sensor according to a second embodiment of the present invention.
Figure 5:
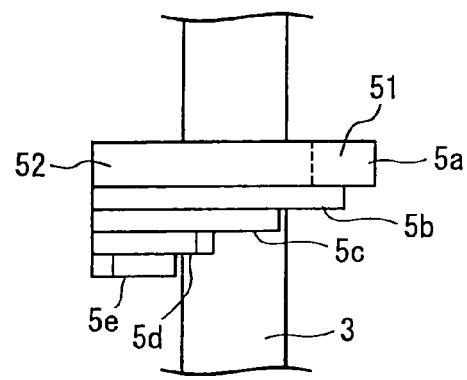
FIG. 5 is a side view showing the ring type current sensor of FIG. 4.

A ring type current sensor according to a second embodiment, as shown in FIGS. 4 and 5, has a core 5 differently formed from the core 1 in the first embodiment. The ring type current sensor except the core 5 has the same assembly as that of the first embodiment.

An effective cross-sectional area of the core 5 perpendicular to a circumferential direction thereof gradually increases from a side of the gap 2 (from both end faces 51) to another side 52 in a diametrical direction of the core 5. Specifically, the core 5 is a stack including a plurality of core plates 5a to 5e. The core plate 5a has a larger thickness than those of the other core plates 5b to 5e. A set of the core plates 5b to 5e are stacked on a side face of the core plate 5a as shown in FIGS. 4 and 5. The gap 2 is defined between both end surfaces of the core plate 5a. The laminated stack of the core plates 5a to 5e are integrated by a fixing member etc. and/or glued with an adhesive made of a highly permeable material.

(Third Embodiment)

Figure 6:
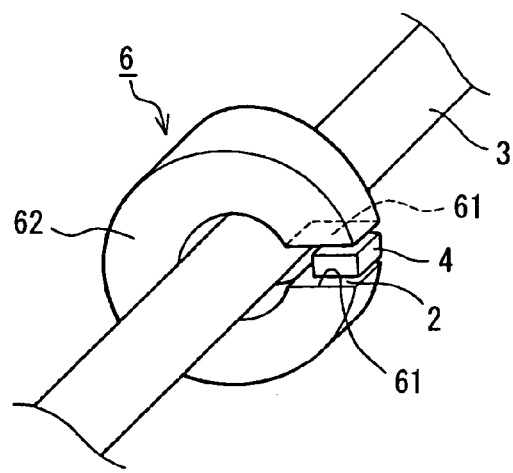
FIG. 6 is a perspective view showing a ring type current sensor according to a third embodiment of the present invention.
Figure 7:
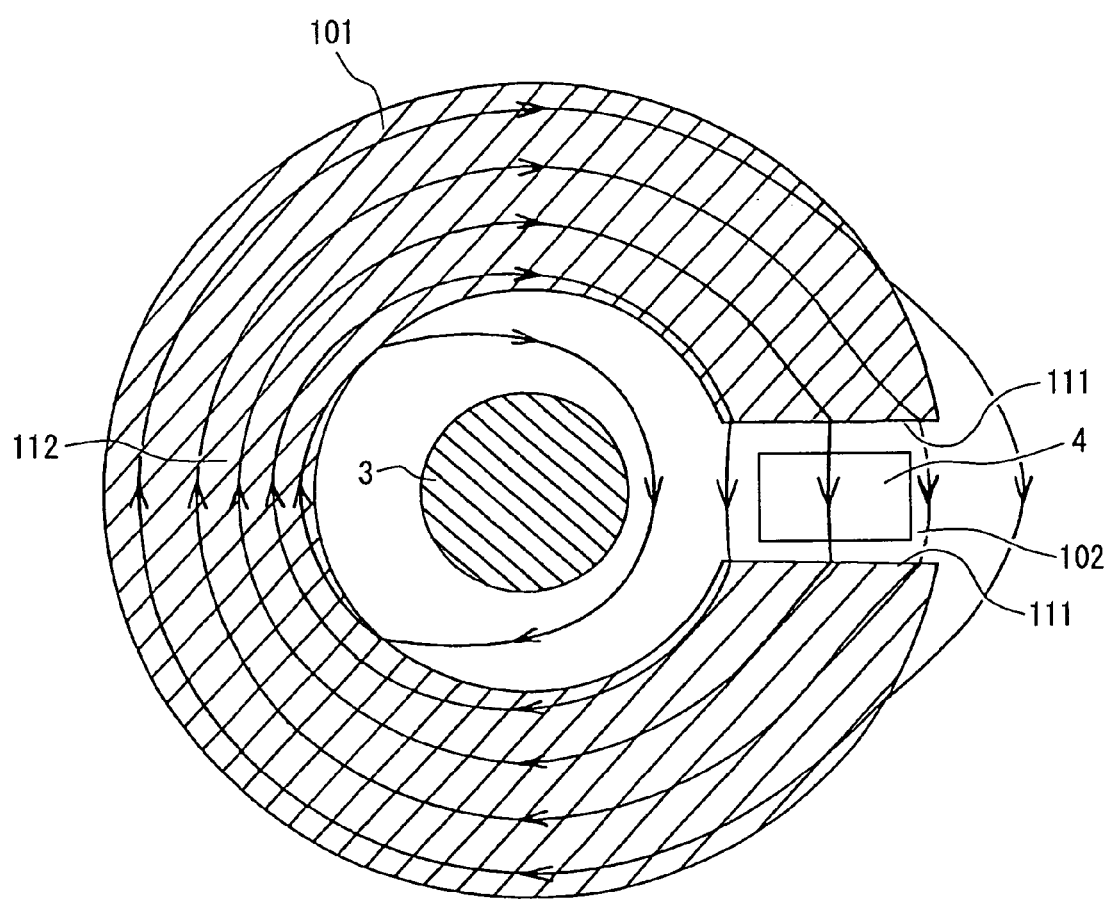
FIG. 7 is a schematic diagram of a magnetic flux line distribution in a core of a conventional ring type current sensor.

As shown in FIG. 6, a ring type current sensor according to a third embodiment has a core 6 having a shape relative to the cores 1 and 2 in the first and second embodiments. The core 6 is made of a highly permeable metallic material such as Fe—Ni alloy as the cores 1 and 5 are. An effective cross-sectional area of the core 6 perpendicular to a circumferential direction thereof gradually increases from a side of the gap 2 to another side 52 diametrically opposite to the gap 2. Specifically, the core 6 is made of a magnetically highly permeable metallic plate material by a winding formation.

(Other Embodiments)

The present invention described in the above embodiment can be modified as follows for example.

The core 1, 5 or 6 made of magnetically highly permeable metallic materials such as Fe—Ni alloy in the above embodiments may also be made of other magnetic material such as ferrite.

The magnetic sensor implemented by the Hall effect sensing device in each of the above embodiments also may be a magneto-resistant device, etc.

The ring type current sensor according to the present invention is apparently applicable to a clamp type current sensor.

This description of the invention is merely exemplary in nature and, thus, variations that do not depart from the gist of the invention are intended to be within the scope of the invention. Such variations are not to be regarded as a departure from the spirit and scope of the invention.

What is claimed is:

1. A ring type current sensor for a conductor comprising:
   a C-shaped core for enclosing the conductor, wherein the C-shaped core has end faces, which face in a circumferential direction of the C-shaped core, and a gap is formed between the end faces, and wherein the core is formed by a stack of C-shaped core plates that are stacked in an axial direction of the core, which is perpendicular to the circumferential direction, and the thickness of each core plate, which is measured in the axial direction, is uniform over the entire circumferential extent of each core plate, and the circumferential lengths of the core plates vary, such that a cross-sectional area of the core perpendicular to the circumferential direction gradually increases from the end faces to an intermediate portion opposite to the gap in a diametrical direction of the core; and
   a magnetic sensor disposed in the gap.

2. The sensor according to claim 1, wherein the thickness of at least one of the core plates is different from that of the other core plates.

3. The sensor according to claim 1, wherein the core is thickest in an axial direction of the core at the intermediate portion.

4. The sensor according to claim 1, wherein a number of core plates stacked in an axial direction of the core is greatest at a location of the intermediate portion.

5. The sensor according to claim 1, wherein at least one outermost core plate has a shorter circumferential length than an adjacent one of the core plates.

6. A ring type current sensor for sensing current in a conductor, the current sensor comprising:
   a C-shaped core for enclosing the conductor, wherein
      end faces of the C-shaped core define a gap, and
      the thickness of the C-shaped core, as measured in an axial direction of the core, gradually increases from each of the end faces to a circumferentially intermediate portion of the core, such that magnetic flux density produced in the core when a current flows through the conductor is approximately uniform over the entire circumferential extent of the core, the C-shaped core is formed by a stack of C-shaped plates, and the circumferential lengths of the C-shaped plates vary, and a magnetic sensor located in the gap.

7. The ring type current sensor according to claim 5, wherein each of the C-shaped plates is generally planar.

8. The ring type current sensor according to claim 6, wherein each of the C-shaped plates has a circumferential length that differs from that of the other C-shaped plates.

9. The ring type current sensor according to claim 6, wherein the thickness of at least one of the C-shaped plates differs from that of the others.

10. The ring type current sensor according to claim 6, wherein the intermediate portion of the core is diametrically opposed to the gap.

11. The ring type current sensor according to claim 6, wherein the thickness of each of the C-shaped plates is uniform along its circumferential length.

12. The ring type current sensor according to claim 6, wherein at least one outermost core plate has a shorter circumferential length than an adjacent one of the core plates.

* * * * *